United States Patent [19]
McCarten et al.

[11] Patent Number: 5,386,191
[45] Date of Patent: Jan. 31, 1995

[54] RF COIL PROVIDING REDUCED OBSTRUCTION ACCESS TO IMAGE VOLUME IN TRANSVERSE MAGNET MRI SYSTEM

[75] Inventors: Barry McCarten, Palo Alto; Joseph W. Carlson, Kensington; Mitsuaki Arakawa, Hillsborough; Leon Kaufman, San Francisco, all of Calif.

[73] Assignee: The Regents of the University of California, Oakland, Calif.

[21] Appl. No.: 25,418

[22] Filed: Mar. 1, 1993

[51] Int. Cl.6 ............................................. G01V 3/00
[52] U.S. Cl. .................................. 324/318; 324/322; 128/653.5
[58] Field of Search ............... 324/300, 307, 309, 314, 324/318, 322; 128/653.5

[56] References Cited

U.S. PATENT DOCUMENTS

| | | | |
|---|---|---|---|
| 4,682,125 | 7/1987 | Harrison et al. | 333/12 |
| 4,829,252 | 5/1989 | Kaufman | 324/309 |
| 4,839,595 | 6/1989 | Boskamp | 324/318 |
| 4,968,937 | 11/1990 | Akgun | 324/318 |
| 5,091,708 | 2/1992 | Bezjak | 324/318 |

OTHER PUBLICATIONS

*Soc. of Magn. Res. in Medicine,* 1988, The Book of Abstracts, vol. 2, Akgun et al: "A Novel Whole-Body Antenna for Transverse Magnet Based NMR System," p. 954.

*Primary Examiner*—Louis Arana
*Attorney, Agent, or Firm*—Nixon & Vanderhye

[57] ABSTRACT

An RF coil sub-assembly for a transverse magnet MRI system includes substantially co-planar serially-connected turns mounted on a common substrate. Preferably, half of the turns are directed clockwise, while the other half are directed counter clockwise to produce a plurality of equal commonly directed currents along spaced apart parallel conductors. A low-loss expanded dielectric spacer is used to mount the RF coils within a pre-existing depression formed by the annular magnetic shims of a transverse magnet structure thus substantially eliminating any obstruction to the image volume for at least the RF transmit coils.

18 Claims, 8 Drawing Sheets

RF COIL PROVIDING REDUCED OBSTRUCTION ACCESS TO IMAGE VOLUME IN TRANSVERSE MAGNET MRI SYSTEM

BACKGROUND OF THE INVENTION

1. Field of the Invention

This invention relates generally to magnetic resonance imaging (MRI) methods and apparatus employing nuclear magnetic resonance (NMR) phenomena. The invention is particularly directed to a novel RF coil (especially useful for transmitting NMR RF nutation pulses into a MR image volume) substantially without obstructing access to the image volume in a transverse magnet type of MRI system.

2. Related Art

MRI systems of many different designs are now commercially available. Some MRI systems utilize solenoidal cryogenic electromagnets to create a uniform static polarizing field $B_o$ to support the NMR phenomenon. Others bracket the MR image volume with a pair of opposed magnet poles. This latter class of MRI systems is sometimes referred to as utilizing a "transverse" magnet structure. As those in the art will realize, such structures have employed permanent magnets and/or electromagnets (which may be either resistive or cryogenic superconducting). The magnetic circuit structure for conducting magnetic flux between the opposing transverse poles of the magnet may take various forms (e.g., "C" shape, "H" or "four-poster" shape). A four-poster type of transverse magnet MRI system is disclosed, for example, in commonly assigned U.S. Pat. No. 4,829,252—Kaufman issued May 9, 1989 and entitled, "MRI SYSTEM WITH OPEN ACCESS TO PATIENT IMAGE VOLUME" (the entire content of which is hereby incorporated herein by reference). One advantage of a transverse magnet system is that it provides relatively unimpeded access to the image volume —at least insofar as the magnet structure itself is concerned.

However, in addition to the static polarizing magnetic field $B_o$ that is required for MRI, there are other magnetic field and RF field requirements as well. As is well known in the art and as is typical in commercially available MRI systems, sets of magnetic gradient coils are employed for quickly switching into effect gradients along mutually orthogonal X,Y,Z coordinates in the background field $B_o$ during selected portions of an MRI data acquisition cycle. In a transverse magnet system, such magnetic gradient coils are typically of a relatively flat pancake-type configuration (e.g., such as those shown in related U.S. Pat. No. 4,829,252—Kaufman, the entire content of which is hereby incorporated by reference).

In order to purposefully nutate NMR nuclei during MRI data acquisition sequences, it is typically necessary at certain times to transmit RF pulses of predetermined frequency spectra, shape, strength, time duration, etc. At other times in the MRI data acquisition cycle, NMR RF response signals are detected from the image volume. These RF responses are subsequently processed to ultimately produce a visual representation of the spatial distribution of NMR nuclei within the object being imaged (e.g., a living human body).

The transmitted NMR RF pulses are typically of relatively high intensity and it is desirable to have such fields as uniformly distributed as possible within the image volume (the RF magnetic field being disposed transverse to the static polarizing magnetic field). One prior art approach has utilized Helmholtz coils in an apertured coil former so as to nevertheless provide some access to the image volume (e.g., through the coil former apertures) even when in place. One such example is the RF transmit coil 601 as depicted in FIGS. 6 and 7 of the related U.S. Pat. No. 4,829,252—Kaufman and as also indicated at reference numeral 100 in FIG. 1 of the present application.

Another prior art RF coil design providing reduced obstruction access to the image volume in a transverse magnet MRI system is found at U.S. Pat. No. 4,968,937—Akgun. Akgun does away with Helmholtz coils or solenoids or the like in favor of opposing current "sheets" defined by RF currents passing along sets of linear conductors disposed above and below the image volume. Although Akgun discloses embodiments wherein some of the linear current paths in each set have varying inter-path spacings, varying numbers of conductors and/or varying conductor dimensions, all of the Akgun current sheets utilize a plurality of conductors electrically connected in parallel with a separate return conductor structure being disposed on another structure fastened to the "back" side of each current sheet structure.

Akgun also suggests that if the return current paths are shielded (e.g., so as to effectively become shielded coaxial RF transmission lines), then they may be "positioned anywhere convenient instead of behind the current sheet" (column 6, lines 7-11). Such a composite and/or shielded structure for the return current path is believed to a major disadvantage of the Akgun approach (e.g., introducing complexity, cost, manufacturing difficulties, etc.). In addition, since the current sheet conductors are all connected in parallel, it may be difficult always to precisely control the distribution of RF currents between the various conductors of the current sheet.

SUMMARY OF THE INVENTION

We have now discovered an improved, substantially flat, RF coil for a transverse magnet MRI system which is of relatively simple structure, while yet offering improved control over RF current distributions.

Our exemplary embodiment of improved RF coil for use in an MRI system having opposed magnet poles utilizes a flat, pancake-like, structure having a plurality of serially-connected turns and including a plurality of juxtaposed linear conductor lengths having commonly directed current flows therewithin. In the exemplary embodiment, there are an even number of such turns with half of them being oriented in a clockwise sense and the other half being oriented in a counter clockwise sense. In this way, we provide "return" current paths that are substantially co-planar and balanced with respect to the MRI system.

In the exemplary embodiment, there are two such turns disposed on a common, flat, substrate. A low-loss expanded dielectric spacer may be disposed on the same substrate for maintaining a uniform predetermined spacing between the RF coil and the gradient magnetic field coil structure (which is sandwiched between the RF coil and the transverse magnet poles). Although the linear conductor lengths in the exemplary embodiment are substantially straight and parallel, those in the art will appreciate that other spatial paths for these linear conductor lengths may also be utilized. Nevertheless, because such turns are connected in series and because the coil dimensions are substantially less than 0.10 wavelength, it is known that substantially the same RF current will flow along the linear conductor lengths which are important for generating the NMR RF nutating fields within the image volume.

As noted, in the exemplary embodiment, a pair of such RF coils are utilized. The coils are disposed on opposite sides of the image volume of the MRI system and spaced from the magnetic gradient coils which are also associated with the opposed magnet poles of the MRI system. Respectively associated local tuning and impedance matching circuits are associated with each such RF coil and fed from a common RF power splitting circuit in the exemplary embodiment.

The exemplary embodiment also utilizes a bank of diode switch circuits locally associated in series with each of the RF coils for effectively disconnecting the RF coils during at least the RF receive times (assuming that a different RF coil is used for RF reception). A special DC router circuit is also employed between the power splitter and the tuning/impedance matching circuits so as to maintain the diode switch bias current isolated from certain portions of the RF circuit (e.g., from the power splitter where such DC bias currents might be short circuited).

Our novel RF coil may provide a substantially coplanar plurality of serially-connected turns disposed on a common substrate including a plurality of juxtaposed linear conductor lengths having commonly directed current flows.

Viewed from a slightly different perspective, the exemplary RF coil of the this invention provides a flat pancake-like structure having a plurality of serially-connected, oppositely directed, turns including a plurality of juxtaposed linear conductor segments having commonly directed current flows.

In the exemplary system, the ratio of (a) distance between the juxtaposed linear conductor lengths within each coil to (b) the vertical separation distance between the coils (i.e., through the image volume) is preferably 24:53 so as to maximize uniformity of RF fields generated in the image volume for NMR nuclei nutation.

In the exemplary embodiment, the RF coils of this invention, (together with an appropriate low-loss dielectric spacer) substantially fit within an existing depression within the annular magnet pole shim that already exists around the periphery of each magnet pole. Accordingly, addition of the novel RF transmit coil creates only minimal access obstruction to the imaging volume.

It should also be noted that in this exemplary embodiment, the "return" current portions of each turn of the RF coil are arcuate and in relatively close proximity to the magnet pole shims, (thus being somewhat "shielded") and are disposed in a substantially co-planar relationship with the operative linear conductor lengths which provide the requisite NMR RF nutation fields in the image volume.

BRIEF DESCRIPTION OF THE DRAWINGS

These as well as other objects and advantages of this invention will be more completely appreciated and understood by careful study of the following detailed description of the presently preferred exemplary embodiment of this invention, taken in conjunction with the accompanying drawings of which:

FIG. 5 is a schematic drawing of the RF coil depicted in FIG. 3a;

DETAILED DESCRIPTION OF AN EXEMPLARY EMBODIMENT

Figure 1:
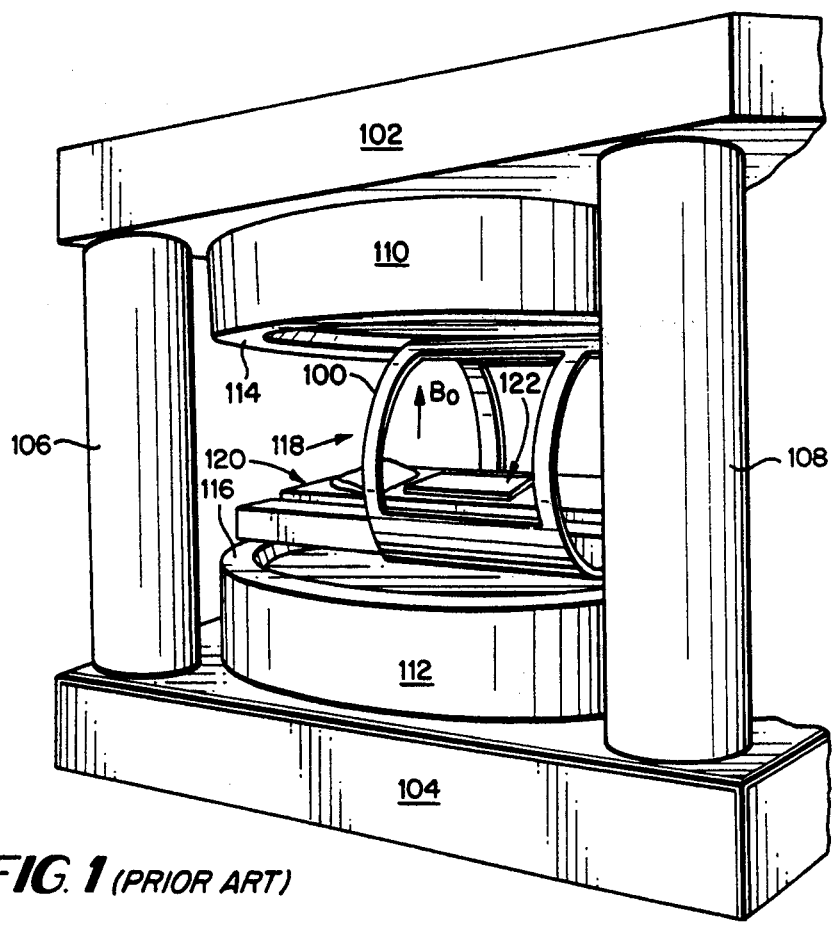
FIG. 1 is a partial perspective view of a prior art transverse magnet MRI system of the kind shown in U.S. Pat. No. 4,829,252—Kaufman.
Figure 2:
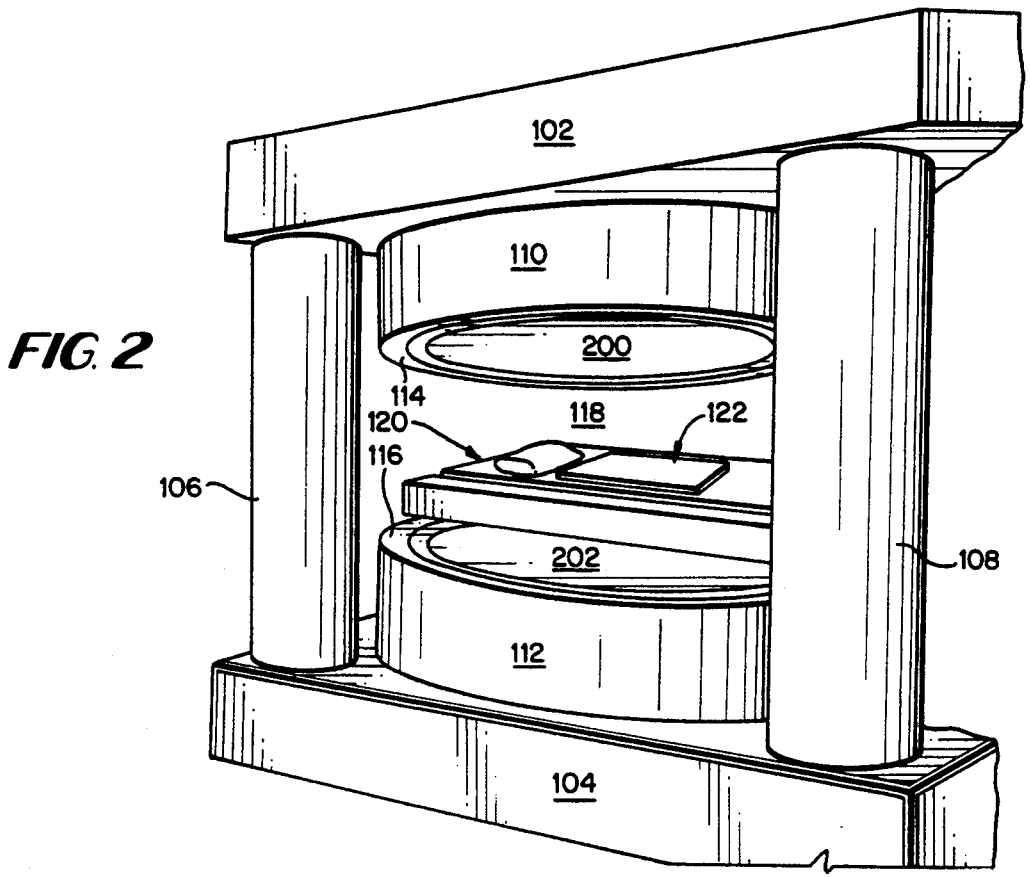
FIG. 2 is a partial perspective view of a similar transverse magnet MRI system but modified so as to incorporate an exemplary embodiment of the non-obstructing RF coils of this invention.

As shown in FIG. 1, prior art transverse magnet MRI systems typically employ massive magnetically permeable structures (e.g., block 102, 104 interconnected by pillars 106, 108) to provide return flux paths for permanent magnets (or electromagnets) which provide magnetic flux sources for an upper transverse pole 110 and a lower transverse pole 112. Although the ferrous magnetic structure is typically covered with a decorative housing of some sort, one can typically nevertheless make out annular raised areas 114, 116 (e.g., in the ACCESS MRI system presently marketed by Toshiba) corresponding to magnetic shims associated with each pole (so as to create a more uniform distribution of static polarizing magnetic field $B_o$ within the central MR imaging volume 118). A patient is conventionally supported and moved into and out of the image volume via patient support bed 120. A relatively small, low-power receive RF coil 122 typically is coupled to the relevant patient anatomy within the imaging volume to receive relatively weak NMR RF response signals emanating therefrom. The receive coil 122 depicted in FIGS. 1 and 2 is especially adapted for imaging portions of the spine and is incorporated within a patient supported pad. Other receive coils of any desired configuration for use with transverse magnet MRI can be used in conjunction with the RF coils of this invention (e.g., when they are used as transmit-only coils).

In prior art systems such as those shown in FIG. 1, a relatively large RF transmit coil 100 typically is also utilized. As those in the art will appreciate, relatively high powered RF pulses are utilized for nutating NMR nuclei (e.g., by 90° or 180°) within the image volume. So as to get substantially uniform transmit RF field distributions, relatively large Helmholtz coils or the like have been utilized. As depicted in FIG. 1 relatively large apertures may be formed in the RF transmit coil 100 so as to provide better access to the image volume during actual MRI procedures. Nevertheless, the RF transmit coil 100 does present an obstruction and it is desirable in many situations to minimize or eliminate such obstruction (e.g., so that all four sides of the four-poster magnet are open for easy patient access and management during actual MRI procedures).

The exemplary MRI system of FIG. 2 is similar to FIG. 1, except the RF transmitter coil 100 has now been replaced by flat, pancake-like RF coil structures 200 (in the upper pole 110) and 202 (in the lower pole 112). As can be appreciated, the new RF transmit coil structures 200, 202 essentially fit within and fill an existing depression within the annular magnet shims 114, 116. The RF coil sub-assemblies 200, 202 are substantially identical in this exemplary embodiment so only the lower coil structure 202 will be explained in detail at FIG. 3a–3c, 4 and 5.

Figure 3A:
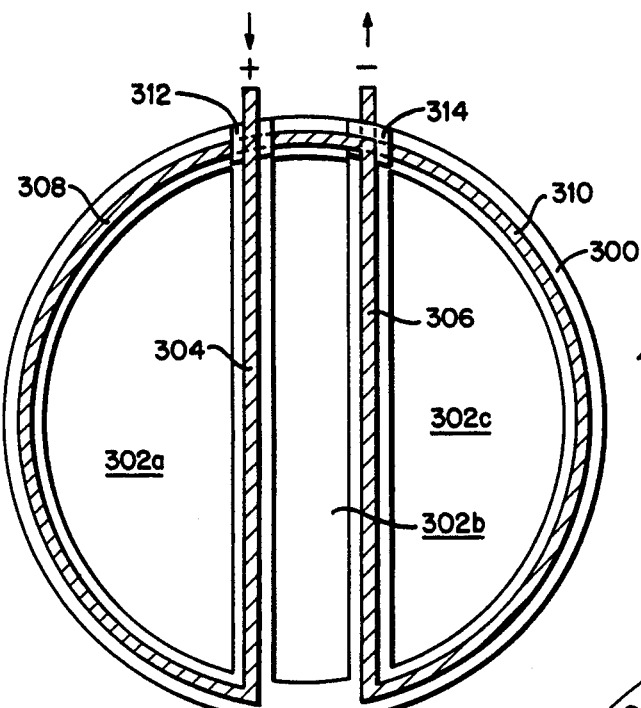
FIGS. 3a and 3b show the outer and inner (with respect to the image volume) sides respectively of the exemplary RF coil subassemblies utilized in the embodiment of FIG. 2.
Figure 3B:
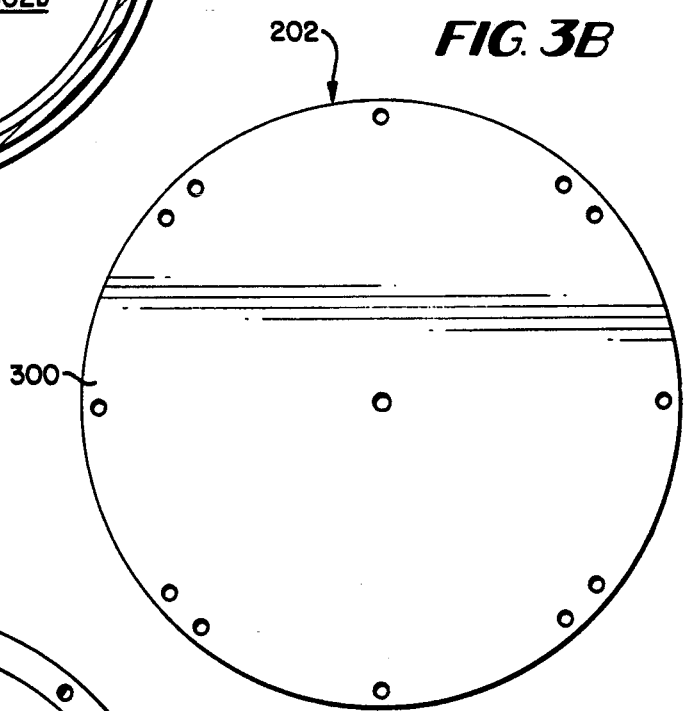
Figure 3C:
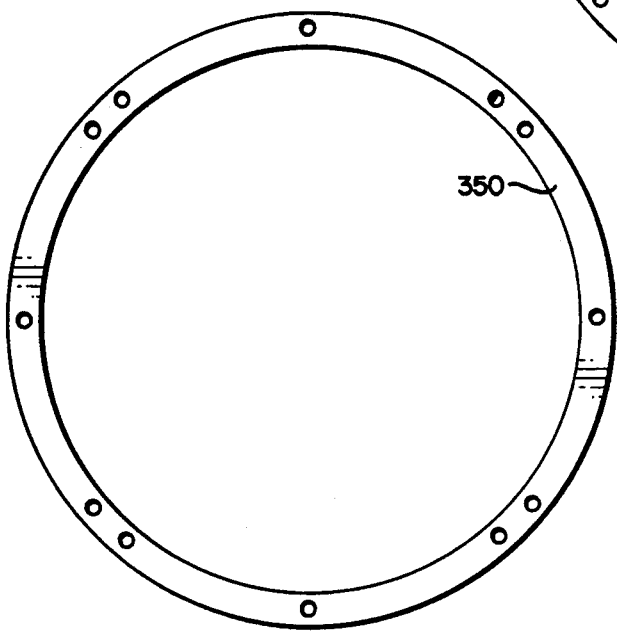
FIG. 3c depicts a "hold down" ring that is utilized in structurally assembling the coils of FIGS. 3a, 3b into the annular magnet pole shims as depicted in FIG. 2.

The distal side (with respect to the patient volume 118) of the RF coil subassembly 202 is depicted at FIG. 3a while the proximal side is depicted at FIG. 3b. The RF coil itself is formed by a flat copper strip (approximately 0.010" thick by approximately by 1 inch wide) cemented to the distal side of the insulating circular substrate 300 (e.g., ABS plastic). Accordingly, the coil structure is substantially co-planar. Between the copper conductors of the coil are low-loss expanded foam dielectric spacers 302a, 302b, and 302c. In the exemplary embodiment, the expanded foam spacers are 9/16 inch styrofoam while the ABS plastic substrate 300 is ⅛ inch thick.

Figure 5:
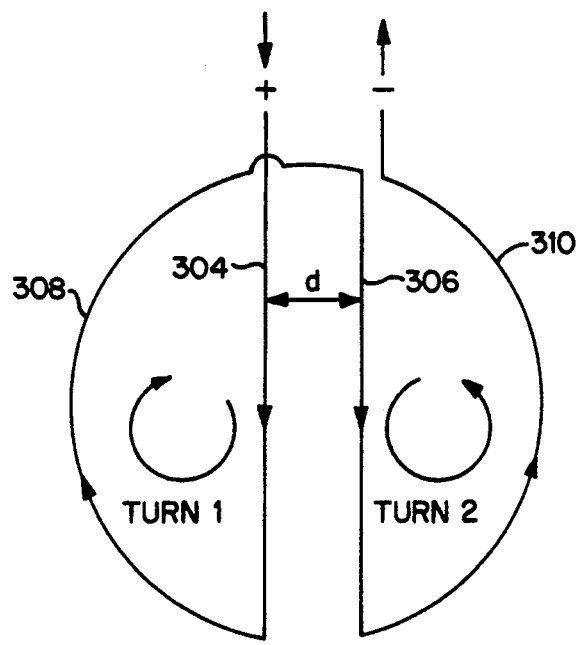

The RF coil conductor itself provides two serially-connected juxtaposed linear conductor lengths 304, 306 together with outer perimeter (arcuate) "return" conductor lengths 308, 310. This effectively defines a two turn coil as schematically depicted in FIG. 5. As will be appreciated, suitable insulating layers are utilized in the minor overlap areas, 312, 314 so as to prevent the overlapping conductors from short circuiting.

Figure 4:
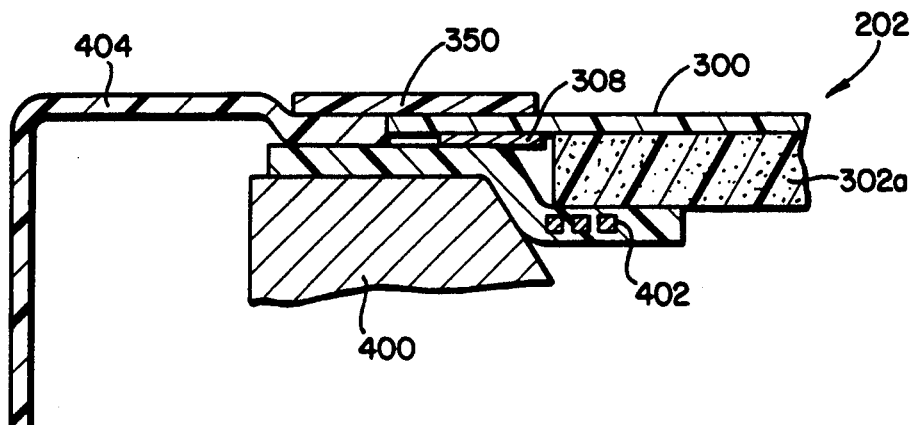
FIG. 4 is a partial cross-section further detailing the mechanical disposition of the RF coils in the exemplary embodiment of FIG. 2.

As shown in FIG. 4, the exemplary RF coil assembly 202 fits within a preexisting depression of the annular magnet shim 400 and a mating gradient coil assembly 402. At the juncture of substrate 300 with existing magnet housing 404, the hold-down ring 350 is utilized so as to maintain structural integrity of the joint and/or to present a more aesthetically pleasing joint. As will be seen, the expanded foam dielectric spacer 302a fits against the gradient coil structure 402 so as to maintain uniform predetermined separation therebetween. In general, the greater the separation, the better, insofar as high Q for the RF transmitter coil is desired. On the other hand, one does not want too much separation else there will be some obstruction to the inter-pole volume.

In the exemplary embodiment, the RF coil assembly 202 fits directly adjacent its respectively associated gradient coil assembly and has an overall thickness of less than one inch so as to essentially fit within the preexisting depression within the annular shim of the magnet poles. Since the coil conductor in the exemplary embodiment is strictly co-planar, it might be thought of as a single turn. However, as depicted in FIG. 5, it is actually two adjacent turns, one directed clockwise and the other directed counter clockwise so as to provide symmetrical dispersed current return paths 308, 310 — while yet connecting the operative linear conductor lengths 304, 306 in series to ensure that the current flowing therewithin is equal and in a common direction. As can be seen in FIG. 4, the return conductors 308, 310 turn out to be closely adjacent magnet shim 400 (which may be useful in helping to reduce the influence of return path generated fields in the image volume).

In the exemplary embodiment, each RF coil assembly 02 has a total inductance of approximately 2.6 microhenries and a Q of about 100 when installed inside the magnet. The current flows are depicted with arrows along the schematically shown conductors of FIG. 5 for a given assumed polarity of instantaneous RF voltage excitation. As will be noted, the current flows in the same direction in both of the linear conductor lengths 304, 306. In addition, since these conductors are serially connected, substantially the same current will be flowing in both conductors. As depicted in FIG. 5, these conductors in the exemplary embodiment are straight and parallel and separated by a distance d. The direction of the current flowing in these conductor lengths, 304, 306 must be the same unless one wishes to purposefully make a gradient RF field.

Figure 6:
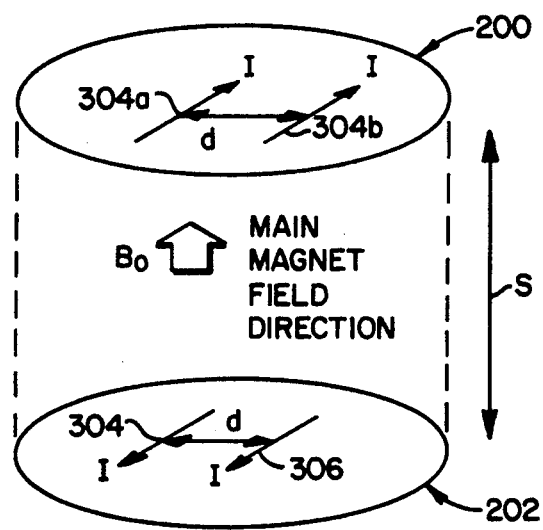
FIG. 6 is a schematic perspective drawing of operative linear conductor lengths utilized in both the upper and lower RF coil assemblies of the exemplary embodiments in FIG. 2.

As schematically depicted in perspective at FIG. 6, although the direction of current flow within each coil along conductor segments 304, 306 must be the same, the parallel current flows in the other coil on the opposite side of the image volume should be in the opposite direction. Accordingly, as depicted in FIG. 6, the current in conductor lengths 304a, 304b of the upper transmit coil subassembly are directed oppositely to the currents in conductors links 304, 306 in the lower transmit coil subassembly.

The two coil subassemblies are separated by a distance S as depicted in FIG. 6. In the exemplary embodiment, the distance d is approximately 24 centimeters, while the distance S is approximately 53 centimeters. The ratio d/S is considered important and has been determined in this exemplary embodiment by computer simulation to maximize uniformity of NMR RF nutation fields within the image volume. As will be appreciated, if non-parallel, non-straight conductor lengths, non-planar configurations, additional turns, etc are utilized, then other optimum spatial locations of the operative RF coil conductors may be utilized for maximum field uniformity within the image volume.

Figure 11:
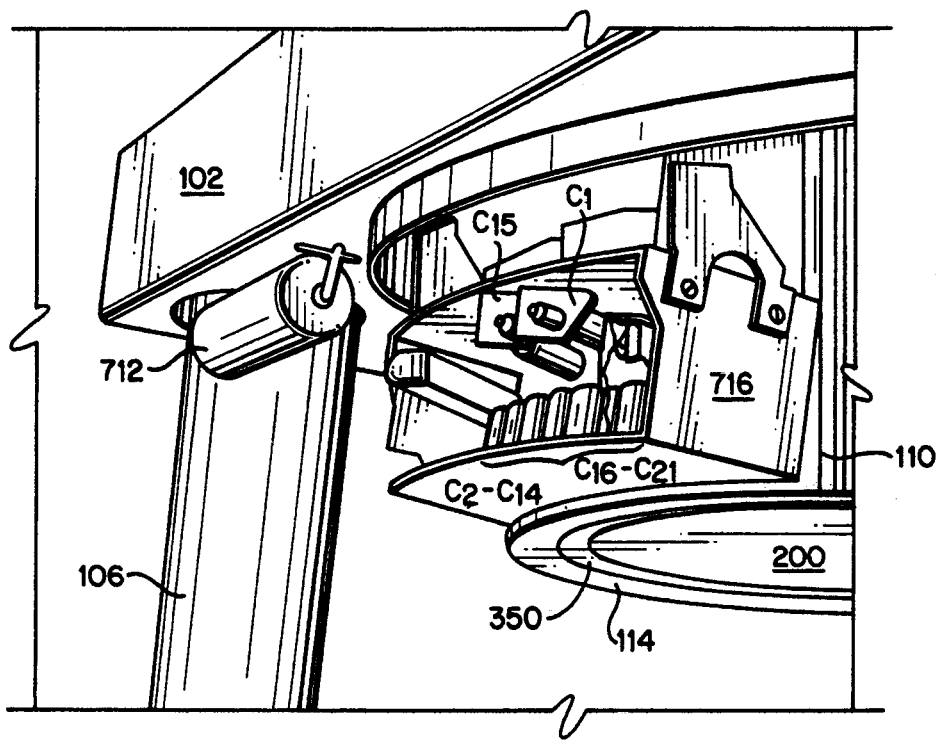
FIG. 11 is a perspective view showing the structural disposition of the tuning/matching circuits and ground breaker circuits in the exemplary embodiment of FIG. 2.
Figure 12:
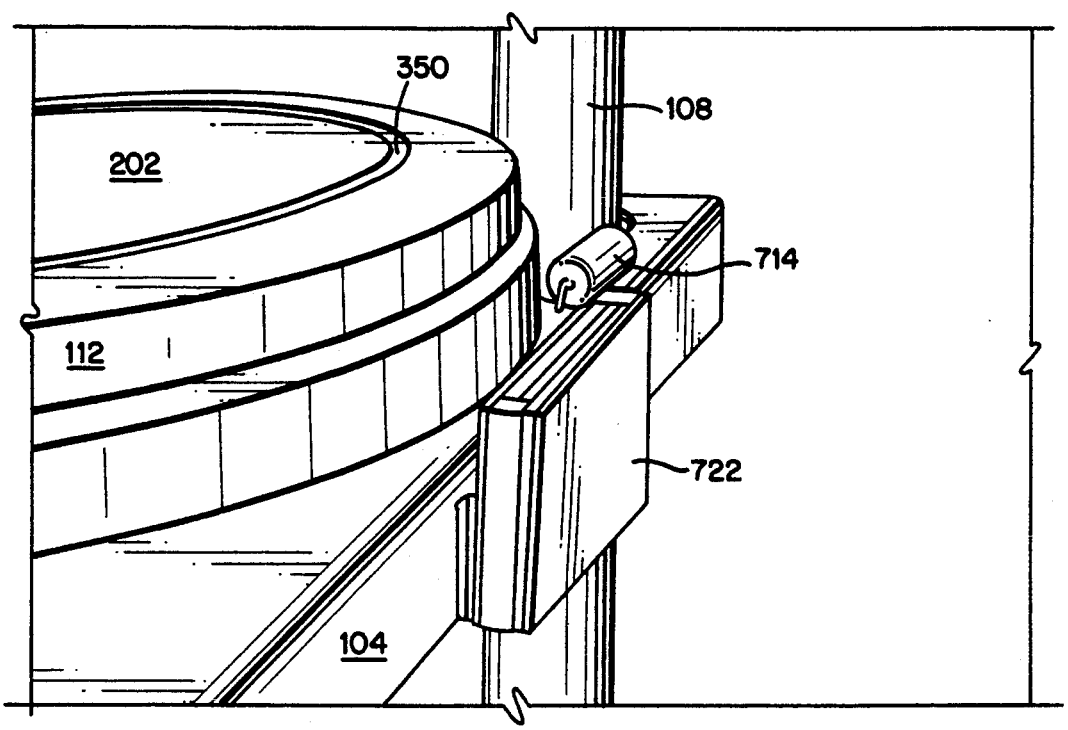
FIG. 12 is a partial perspective view showing the physical disposition of the PIN diode banks used in the exemplary embodiment of FIG. 2.

Each RF coil subassembly 200, 202 is matched and tuned separately to the desired transmission line impedance (e.g., 50 ohms) and fed from a conventional hybrid power combiner/splitter. In early experiments, the two coil subassemblies were treated as a common coil and tuned/matched in this fashion. However, such arrangement resulted in difficult tuning adjustments (in part because of the relatively long interconnecting wires which must be used to connect the two subassemblies together and their coupling with other structures in the MRI system). FIG. 11 shows the matching/tuning network used for the upper coil assembly (as well as the ground breaker for the upper assembly) while FIG. 12 shows a diode switching bank and ground breaker utilized with the lower coil assembly. It will be appreciated that identical matching/tuning networks and diode bank switches are utilized with both coil assemblies.

Figure 7:
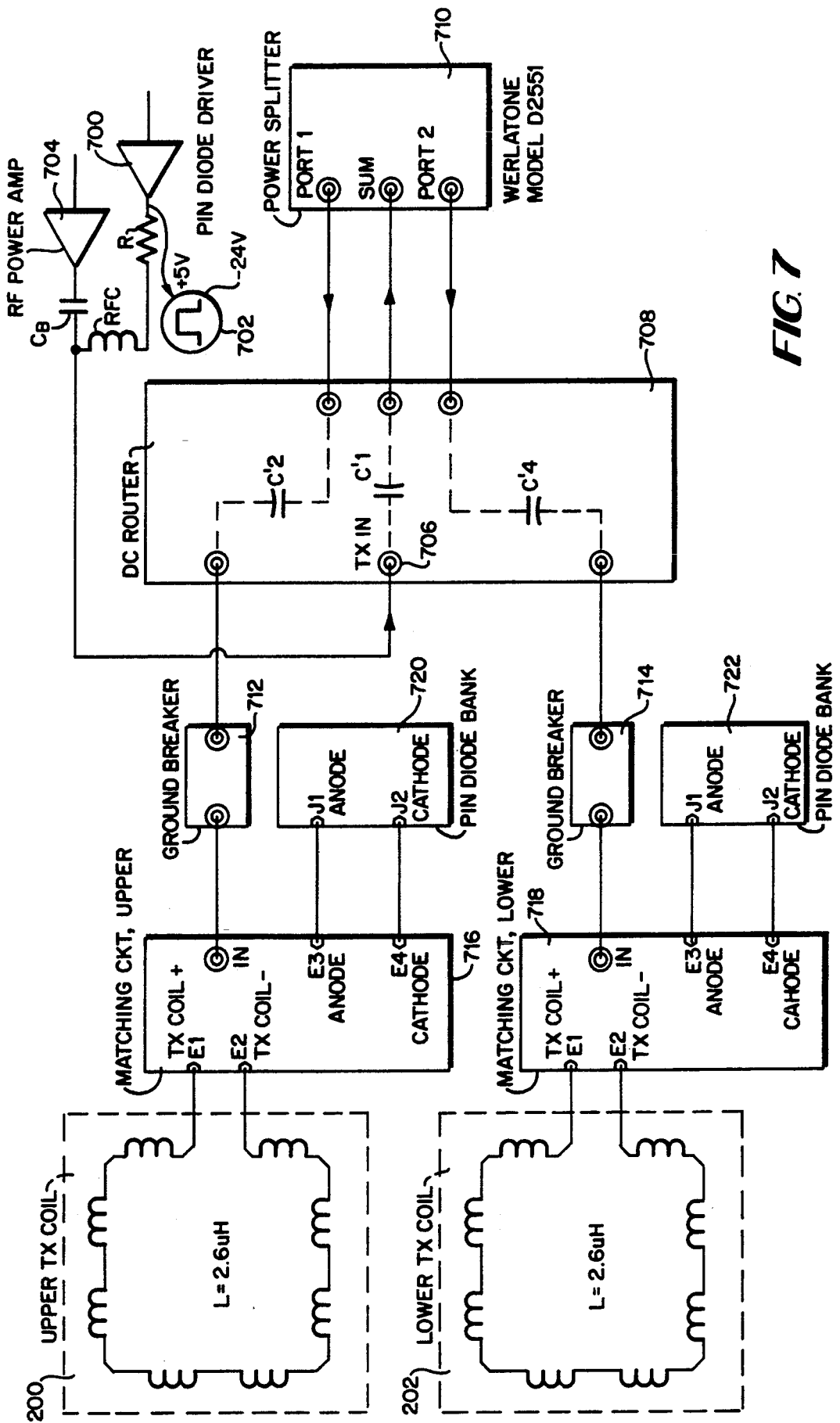
FIG. 7 is a schematic and block diagram of the overall RF transmit coil subassembly for the exemplary embodiment of FIG. 2.

An overall schematic diagram of the RF transmit coil system is depicted in schematic and block diagram form at FIG. 7. Here, when it is desired to transmit an RF NMR nutation pulse, the PIN diode driver 700 will be activated (e.g., by the MRI sequence control computer) to provide PIN diode bias 702 via current limiting resister R and RF choke RFC. Capacitor $C_b$ isolates the upstream RF circuitry such as the RF power amplifier 704 from the DC PIN diode biasing circuitry. Thus, both DC bias and RF is provided to the transmitter input pin 706 of the DC router circuitry 708. Insofar as the RF signal is concerned, the dotted line capacitance connection shown in FIG. 7 routes the incoming RF to the sum or input terminal of power splitter 710. Substantially equal magnitude and equal phase RF power is then output from the power splitter at ports 1 and 2 and directed respectively to the upper transmit coil and lower transmit coil via ground breakers 712 and 714. Further details concerning ground breaker construction may be found in issued U.S. Pat. No. 4,682,125—Harrison et al, issued Jul. 21, 1987 and entitled, "RF COIL COUPLING FOR MRI WITH TUNED RF REJECTION CIRCUIT USING COAX SHIELD CHOKE". Further improvements in such ground breaker circuits may be found in related commonly assigned copending application Ser. No.07/921,107, naming Arakawa et al as inventors, filed Jul. 29, 1992, and entitled, "MRI RF GROUND BREAKER ASSEMBLY". The entire content of both this related patent and patent application are hereby incorporated by reference. As those in the art will appreciate, the purpose of the ground breaker is to prevent RF signals from passing over the outside of the coaxial cable connection and thus interfering with desired impedance matching and resonant circuit tuning operations.

RF power of equal magnitude and phase is thus applied to the "IN" terminals of the upper matching circuit 716 and the lower matching circuit 718 respectively as shown in FIG. 7. From here, the RF power is, in effect, transferred serially through the respective upper and lower transmit coils and their associated PIN diode banks 720, 722. As will be explained in more detail below with respect to DC router 708, there is a DC bias path serially provided through the PIN diode banks 720, 722 such that they are both controlled simultaneously by the same PIN diode drive input 702. The DC router circuitry 708 not only provides this desired DC bias circuit, it also effectively isolates the DC bias circuit from the power splitter 710 which might otherwise act to short circuit the DC bias.

The prior art exemplary system of FIG. 1 normally requires approximately 120 watts of transmitter power for effecting a 90° NMR RF nutation pulse or a 180° NMR RF nutation pulse. To obtain good linearity of RF amplifier response, an RF power amplifier of approximately two or three times the actual power utilization rating is normally utilized, e.g., about 300 watts in the prior art embodiment of FIG. 1. However, in testing the exemplary embodiment of FIG. 2, it has been discovered that considerably more RF transmit power is required to effect the required NMR RF nutations. For example, approximately 1.2 kilowatts of RF transmit power has been utilized with the exemplary embodiment. So as to achieve good linearity, a substantially higher rated RF power amplifier was utilized. In laboratory experiments with the exemplary embodiment, an available Henry Radio ten kilowatt RF power amplifier was utilized so as to assure good linearity of RF amplification at the actually utilized power levels. In part, such higher power levels are required because the RF coil now is so closely associated with magnetic circuit components, which in the exemplary embodiment, may utilize laminated pole pieces and the like.

The diode switch banks in the exemplary embodiment typically dissipate approximately 20 to 40 watts. Therefore, to avoid possible temperature-induced variations in the magnetic circuit components, the diode switch banks are preferably located outside the magnet structures and provided with ample external heat dissipation sinks. Each switch bank in the exemplary embodiment utilizes five PIN diodes from M/A COM (part no. MA4P709-150).

In the exemplary embodiment, it has been noted that inter-coil coupling is less than −20 dB. Accordingly, the two coils can be separately tuned as independent subsystems.

Figure 8:
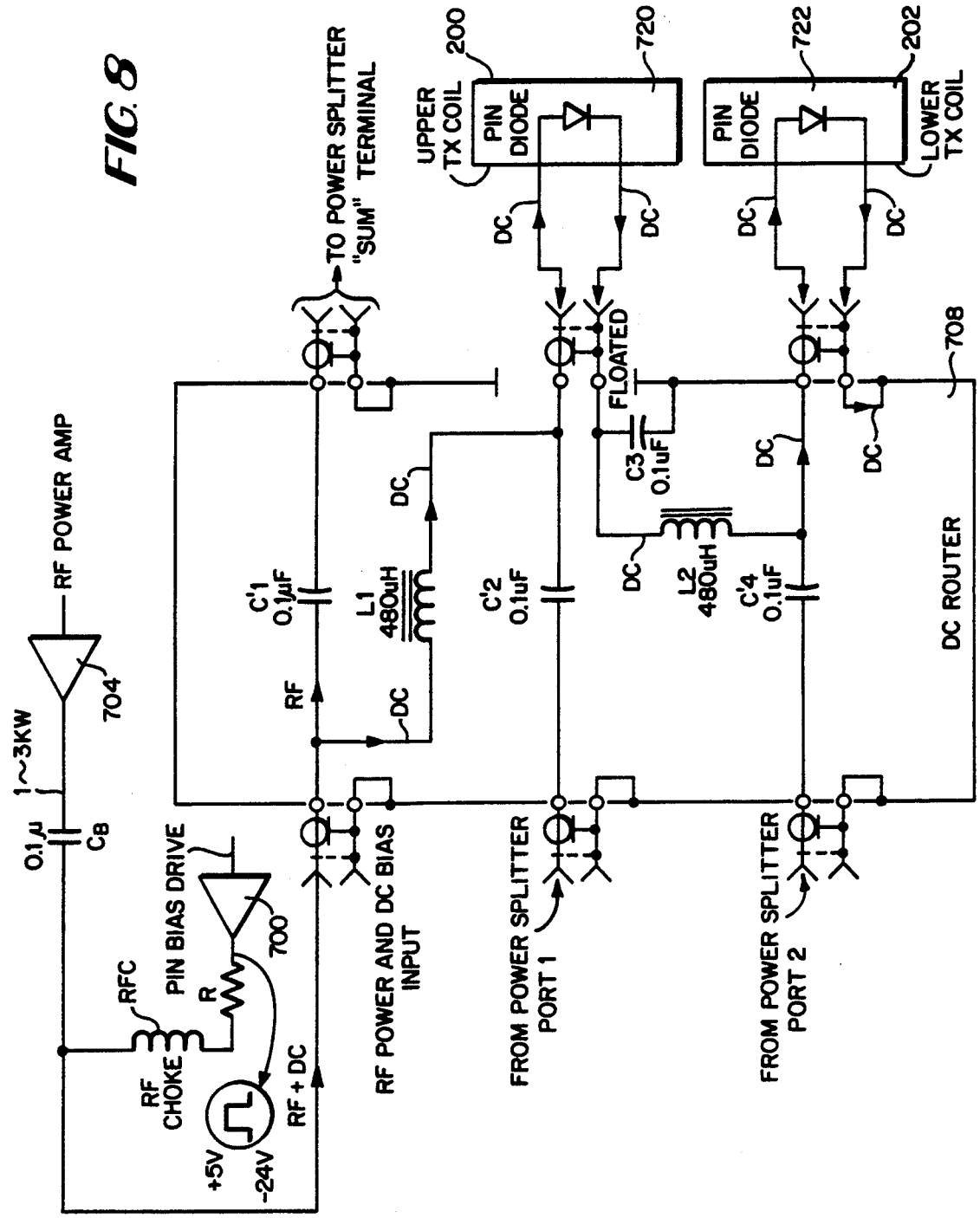
FIG. 8 is a more detailed schematic diagram of the DC router circuitry shown in FIG. 7.

The DC bias circuitry is shown in more detail in connection with DC router 708 at FIG. 8. Here, the RF connections through bypass capacitors $C'1$, $C'2$, and $C'4$ (as already depicted by dotted lines in FIG. 7) are shown expressly. In addition, the DC bias path is now specially denoted with arrows and the reference letters "DC". It extends from the center conductor of the input RF connector through choke L1, through the center conductor of the RF connector leading to the upper transmitter coil and PIN diode array 720, back through the floated shield conductor of that same RF connector and choke L2 to the inner conductor of the RF connector leading to the lower transmit coil and its PIN diode array 722. From thence, the DC circuit is completed through the shield of that cable connection to ground (i.e., the chassis of the DC router 708).

Figure 9:
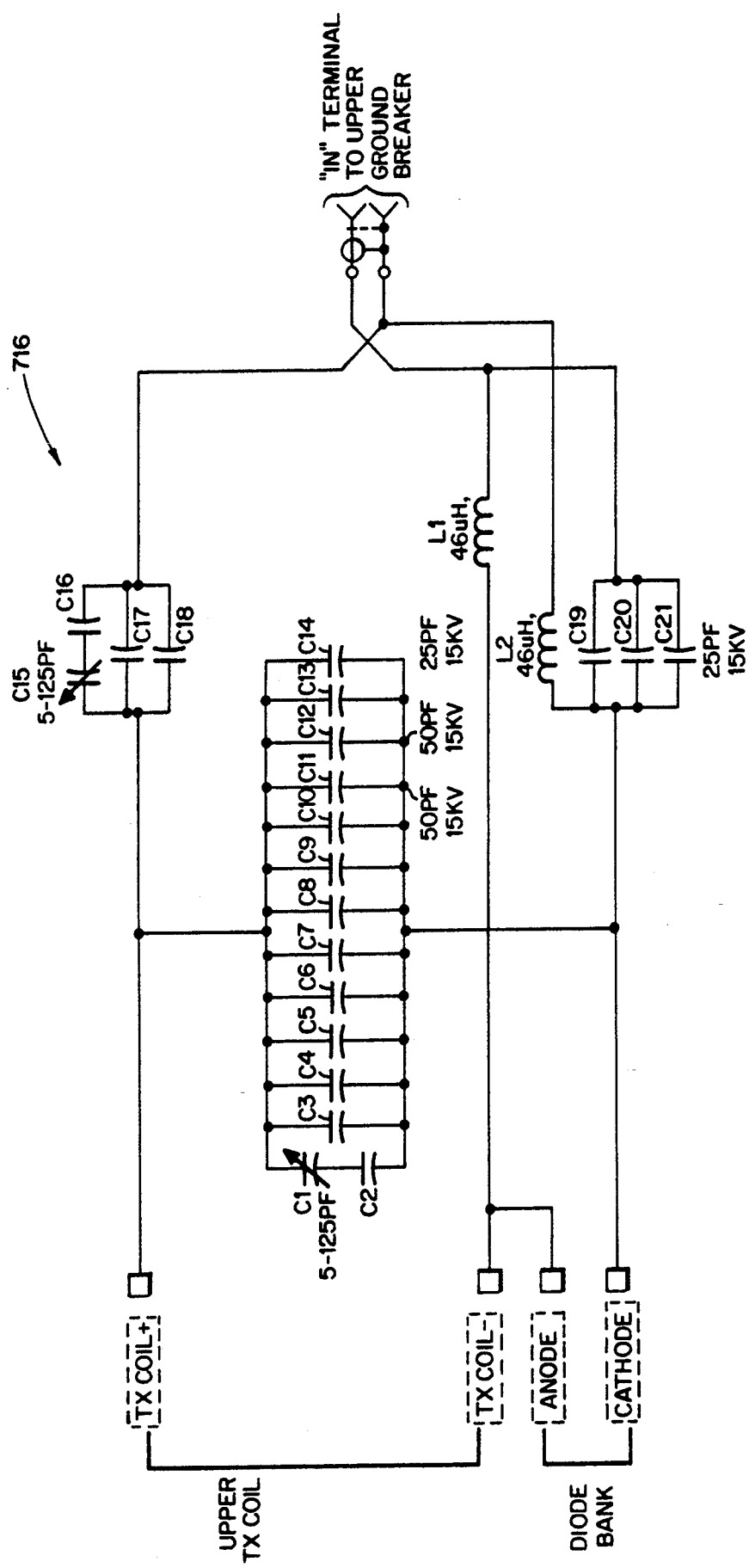
FIGS. 9 and 10 are more detailed schematic diagrams of the upper and lower matching/tuning circuits as shown in FIG. 7.
Figure 10:
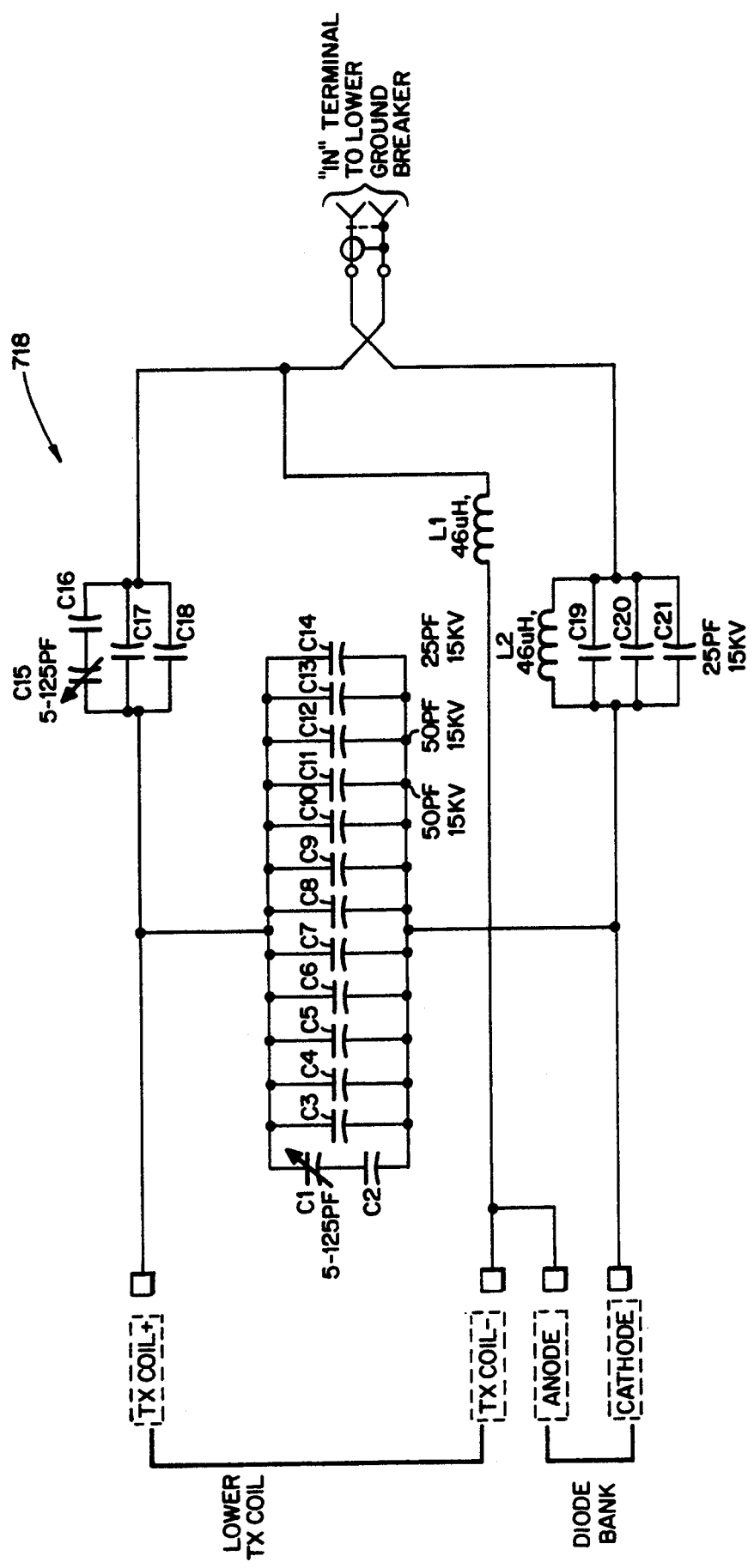

FIGS. 9 and 10 show the matching circuits 716, 718 of FIG. 7 in more detail. Except for reversed polarization connections to the transmit coils 200, 202 (to ensure that oppositely directed currents flow in the relevant conductors of the upper and lower transmit coils, respectively as shown in FIG. 6), the circuits of FIGS. 9 and 10 are substantially identical. As will be appreciated by those in the art, capacitors C1–C14 provide parallel capacitance for the relevant transmit coils while capacitors C15–C21 provide series capacitance. Suitable variability for matching/tuning adjustments is provided as indicated so as to present a matched 50 ohm impedance connection for interconnecting transmission lines. As will be appreciated, the inductances shown in these figures comprise part of the DC bias circuitry for the switched diode banks. Actual values for the exemplary embodiment capacitors are shown in FIGS. 9 and 10 (unless otherwise marked, the remaining capacitors are of a 100 picofarad 15 kilovolt rating).

Convenient locations for the locally situated matching/tuning circuits 716, ground breaker 712, 714 and PIN diode bank 722 are depicted in FIGS. 11 and 12 and are believed to be self-explanatory in view of the foregoing explanation.

While only one exemplary embodiment of this invention has been described in detail, those skilled in the art will recognize that many variations and modifications may be made in this exemplary embodiment while yet retaining many of the novel features and advantages of this invention. Accordingly, all such variations and modifications are intended to be included within the scope of the appended claims.

What is claimed is:

1. An RF coil for the generation of a substantially homogeneous RF magnetic field for use in an MRI system having opposed magnet poles, said RF coil comprising:
   a pair of spaced apart flat pancake-like structures disposed on opposite sides of an imaging volume of the MRI system, each structure having a plurality of serially-connected turns including a plurality of juxtaposed conductor lengths having commonly directed current flows therein.

2. An MRI RF coil as in claim 1 wherein:
   said turns of each structure are of even number with half being oriented in a clockwise sense and the other half being oriented in a counter-clockwise sense.

3. An MRI RF coil as in claim 1 wherein:
   said turns of each structure are disposed on a common, flat, substrate.

4. An MRI RF coil as in claim 3 wherein each structure further comprises a low-loss expanded dielectric spacer disposed on said substrate for maintaining a uniform predetermined spacing between the RF coil and magnetic field generating structures of the MRI system.

5. An MRI RF coil as in claim 1 wherein said turns of each structure are disposed in a D-shaped path and are substantially co-planar.

6. An RF coil as in claim I wherein said conductor lengths of each structure are substantially straight and parallel.

7. An RF coil as in claim 1, each said structure being spaced from magnetic gradient coils associated with opposed magnet poles of the MRI system.

8. An RF coil as in claim 7 in combination with a pair of tuning and impedance matching circuits, each being respectively connected to a corresponding one of the structures and to a common RF power splitting circuit.

9. An RF coil as in claim 8, further comprising:
   a pair of diode switch circuits, each being respectively connected in series with a corresponding one of the structures for effectively disconnecting said structures during at least RF receive times in an MRI data acquisition sequence; and
   a DC router circuit for connecting DC bias currents to said diode switch circuits while isolating RF currents from portions of the DC bias circuits.

10. An RF coil for use in an MRI system having opposed magnet poles, said RF coil comprising:
    a first substantially co-planar plurality of juxtaposed linear conductor lengths having commonly first directed current flows therein, and
    a second substantially co-planar plurality of juxtaposed linear conductor lengths having commonly second-directed current flows therein,
    said first and second conductor lengths each being separated from each other and disposed near a respectively associated one of said magnet poles and said first-directed current flows being disposed opposite to said second-directed current flows.

11. An RF coil as in claim 10 wherein said linear conductor lengths comprise turns that are of even number with half being oriented in a clockwise sense and the other half being oriented in a counter-clockwise sense.

12. An RF coil as in claim 10 wherein said first and second conductor lengths are each disposed on a respectively associated substrate and further comprising a low-loss expanded dielectric spacer disposed on each said substrate for maintaining a uniform predetermined spacing between the RF coil and a magnetic field generating structure of the MRI system.

13. An RF coil as in claim 10 wherein said linear first conductor lengths are substantially straight and parallel with respect to each other and wherein said linear second conductor lengths are substantially straight and parallel with respect to each other.

14. An RF coil for use in an MRI system having opposed magnet poles, said RF coil comprising:
    a first flat pancake-like structure having a plurality of serially-connected, oppositely directed, turns including a plurality of juxtaposed linear conductor lengths having commonly directed current flows therein; and
    a second flat pancake-like structure having a plurality of serially-connected oppositely directed turns including a plurality of juxtaposed linear conductor lengths having commonly directed current flows therein.

15. An RF coil as in claim 14 wherein said turns of each structure are of even number with half being oriented in a clockwise sense and the other half being oriented in a counter-clockwise sense.

16. An RF coil as in claim 14 wherein said turns of each structure are disposed on a common, flat, substrate.

17. An RF coil as in claim 16 wherein each structure further comprises a low-loss expanded dielectric spacer disposed on its said substrate for maintaining a uniform predetermined spacing between the structures and magnetic field generating structures of the MRI system.

18. An RF coil as in claim 14 wherein said linear conductors lengths of each structure are substantially straight and parallel.

* * * * *